United States Patent [19]
Devin

[11] Patent Number: 5,742,546
[45] Date of Patent: Apr. 21, 1998

[54] METHOD AND DEVICE FOR ADDRESS DECODING IN AN INTEGRATED CIRCUIT MEMORY

[75] Inventor: Jean Devin, Allée des Cigales, France

[73] Assignee: SGS-Thomson Microelectronics, S.A., Gentilly Cedex, France

[21] Appl. No.: 526,500

[22] Filed: Sep. 11, 1995

[30] Foreign Application Priority Data

Sep. 12, 1994 [FR] France ................................ 94 10833

[51] Int. Cl.$^6$ ..................................................... G11C 7/00
[52] U.S. Cl. ........................... 365/194; 365/195; 365/196; 365/233.5; 365/320.06
[58] Field of Search ............................. 365/194, 195, 365/196, 233.5, 230.06

[56] References Cited

U.S. PATENT DOCUMENTS

| | | | |
|---|---|---|---|
| 5,029,135 | 7/1991 | Okubo | 365/203 |
| 5,400,279 | 3/1995 | Momodomi et al. | 365/185 |
| 5,414,659 | 5/1995 | Ito | 365/200 |
| 5,430,682 | 7/1995 | Ishikawa et al. | 365/226 |

FOREIGN PATENT DOCUMENTS

| | | |
|---|---|---|
| 0030118 | 6/1981 | European Pat. Off. . |
| 0105757 | 4/1984 | European Pat. Off. . |
| 0306392 | 3/1989 | European Pat. Off. . |
| 0558079 | 9/1993 | European Pat. Off. . |

OTHER PUBLICATIONS

Patent Abstracts of Japan, vol. 2, No. 149 (E–78), Dec. 13, 1978, and JP–A–53 117342 (Nippon Denki), Oct. 13, 1978.

*Primary Examiner*—David C. Nelms
*Assistant Examiner*—Hien Nguyen
*Attorney, Agent, or Firm*—Robert Groover; Betty Formby; Matthew Anderson

[57] ABSTRACT

In a method for the decoding of the addresses of a memory, a pulse is generated at output of a filtering circuit at each change of address detected at the address bus to inhibit the address decoder during a determined duration. The filtering signal is applied more particularly to the row decoder which selects a row corresponding to an address applied to the input of the decoder and applies a control voltage to this row. This method is particularly advantageous in low-voltage memories.

20 Claims, 3 Drawing Sheets

METHOD AND DEVICE FOR ADDRESS DECODING IN AN INTEGRATED CIRCUIT MEMORY

CROSS REFERENCE TO RELATED APPLICATION

This application claims priority from French App'n 94-10833, filed Sep. 12, 1994, which is hereby incorporated by reference. However, the content of the present application is not necessarily identical to that of the priority application.

BACKGROUND AND SUMMARY OF THE INVENTION

The invention relates to a method of address decoding in an integrated circuit memory, and to a corresponding memory.

The present trend in integrated circuits is towards a search for increasingly large-scale integration as well as towards the reduction of the voltages and power values required. Through technological innovations, particularly in the field of memories, swift progress is being seen and low-voltage memory circuits of the order of 3 volts are already being proposed.

However, to maintain the performance characteristics in terms of the speed and reliability of these low-voltage circuits, it is necessary in particular to resort to a voltage multiplier circuit to apply a sufficient reading voltage to the rows of memory cells. These, it may be recalled, control the gates of the cells so that the cells that are on will draw sufficient current on the columns (which connect the drains) and so that their ON state can be detected swiftly and reliably at output by the reading circuits (connected to the columns).

The structures used for example for these voltage multipliers are charge pump structures which are well known to those skilled in the art. The general principle of these pumps is that the capacitors are charged in parallel and discharged in series by the use of arrays of diode-operated or transistor-operated switches controlled by clocks. Reference may be made to the U.S. Pat. No. 4,839,787. A voltage multiplier is notably characterized by its number of transistors and capacitors, its internal resistance and its capacity to deliver a given current for a given time and at an output voltage that is as constant as possible: in other words, for a given output charge, this given time is the time at the end of which the output voltage will start collapsing. The latter characteristic is particularly difficult to handle. It hampers the use of multipliers unless the structure used is one that is costly in terms of surface area and consumes a great amount of current (owing to the number and characteristics of the transistors and capacitors used).

The asynchronous memory circuits, namely circuits that receive no external clock signal, may receive data elements all the time. These data elements are immediately taken into account and the corresponding operations are performed. In particular, the addresses that arrive are decoded immediately. The access time of these memories is thus highly efficient. Since the memories are low-voltage asynchronous memories, they are capable of taking account of a new address very swiftly. The corresponding rows and columns of the memories are selected and the command voltages are applied. In particular, in reading mode, which is generally the default access mode, the read voltage given by the multiplier is applied to the addressed row. Subsequently when the circuit receives the command to give the result (activation of the output enable signal, commonly referenced OE), all that remains to be done then is to activate the output read circuits and the result is then swiftly available at the external data bus.

Now, the memory addresses are given by an internal bus which may be noisy (due to parasitics) or shared with other integrated circuits. If the decoder of the memory takes account of all the changes in address on the external bus, a selection is made, in rapid succession, of the different rows (which are capacitive loads) to which the voltage coming from the multiplier is successively applied. The multiplier no longer has the time that it needs to get recharged between two row selections and collapses. The voltage at output of the multiplier diminishes dangerously towards zero before gradually rising again. The time taken to recharge the multiplier is particularly lengthy. It is in the range of about a hundred nanoseconds.

If the command to give the result at output (OE) for an address selected in reading mode is received at a time when the multiplier is discharged, the reading is not significant. This raises in practice a problem of reliability.

INNOVATIVE CIRCUITS AND METHODS

The invention proposes to resolve this problem of the collapsing of the read voltage of the rows, which is incompatible with the memory access time.

As claimed, the invention relates to a method for the decoding of the addresses of a memory.

According to the invention, at each change of address detected on the address bus, an address decoding inhibition command is generated for a duration d1. Thus, if there are changes in address that succeed one another at an excessively fast rate, these changes will be ignored and the only change chosen will be the last change, the inhibition of the decoder going up to the duration d1 after the last change of address. By contrast, the decoder could process any stable address which remains on the address bus for a duration greater than d1.

The invention also relates to a memory in integrated circuit form comprising an address decoder to select memory cells. According to the invention, the memory comprises a circuit for the filtering of the changes of address to inhibit said address decoder for a determined duration d1 after the detection of a change of address.

More particularly, for a memory organized in matrix form in rows and columns, the invention can be applied to the filtering of the addresses of rows of the memory. According to the invention, with the decoder comprising a row decoder and a column decoder, the filtering circuit sends out a filtering signal applied to the row decoder.

Advantageously, with the row decoder comprising an address decoding circuit to select a row and deselect the others and a circuit for switching voltage to the rows, it furthermore comprises an inhibition circuit that receives the filtering signal at input to inhibit the voltage switching circuit. Thus, in this embodiment the decoding of the address circuit is done in any case, and it is only the switching of the read voltage over to the row that is inhibited. In this way, the time of access to the memory is practically unchanged, the decoding of the address being slower than the switching of voltage over to the rows. Preferably, the duration of inhibition is chosen so as to be in the range of the maximum duration needed for the decoding of the address (worse case).

For the filtering circuit, the circuits used are an address detection circuit and a circuit for the generation of a pulse of a determined duration upon reception of an input pulse. Circuits for the detection of address transitions or transitions in control signals or for the enabling of the circuit are used conventionally in asynchronous circuits to generate the internal clock signals needed for the sequencing of the operations to be performed. Conversely, when there is no address transition, they are used to generate a signal for placing the circuit on standby, providing for greatly reduced consumption by the circuit. The principle of operation of an address detection circuit lies in comparing the current state of an input signal with a previously memorized state to memorize the current state if it is different from the previously memorized state, and generate an output pulse.

Pulse generation circuits are also used in these very same asynchronous circuits at output of the address transition detection circuit to generate the internal clock signals.

BRIEF DESCRIPTION OF THE DRAWINGS

The disclosed inventions will be described with reference to the accompanying drawings, which show important sample embodiments of the invention and which are incorporated in the specification hereof by reference, wherein.

Other features and advantages shall appear from the following detailed description, given by way of an indication that in no way restricts the scope of the invention and with reference to the appended figures, of which.

DETAILED DESCRIPTION OF THE PREFERRED EMBODIMENTS

Figure 1:
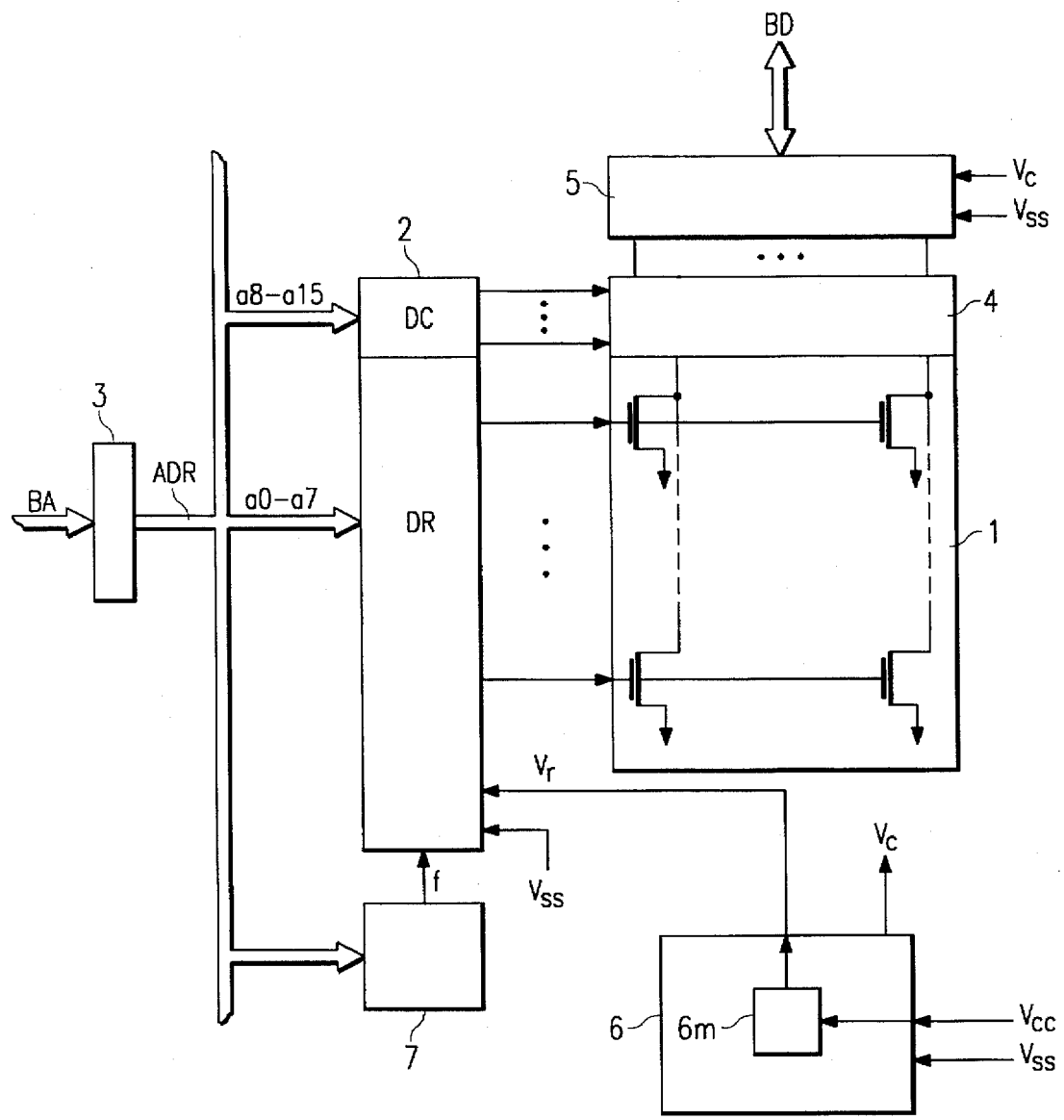
FIG. 1 is a block diagram of a memory comprising a filtering circuit according to the invention.

The numerous innovative teachings of the present application will be described with particular reference to the presently preferred embodiment (by way of example, and not of limitation), in which:

A general and simplified architecture of an integrated circuit memory is shown in FIG. 1. The memory array 1 is formed by columns connected to the drains of the cells and by rows connected to the gates of the cell. The cells are made, in this example, by floating-gate MOS technology. However, the invention is not limited to this example.

The cells at the intersection of the columns and rows are addressed by a column address and a row address. A decoder 2 thus comprises a row decoder DR and a column decoder DC. An address presented by an external address bus BA is memorized in an address register 3 connected at output to the address bus of the memory, referenced ADR. In the example, the internal address bus ADR is divided into two parts: a row address applied at input to the row decoder DR and a column address applied at input to the column decoder DC, encoded in the example respectively on the address bits a0–a7 and a8–a15.

The row decoder directly controls the rows of the memory: it applies a control voltage Vr to the addressed row and grounds the other rows (i.e. connects them to Vss). The control voltage may be a read or write voltage.

The column decoder controls a gate circuit 4 that applies the control voltage (Vc) to the addressed column or columns and the ground voltage (Vss) to the others. It connects the columns to the data input or output circuits that are grouped together under the reference 5 and connected to the external data input/output bus BD of the memory.

The control voltages for the columns and rows come, for example, from a voltage generation circuit 6 receiving the voltages Vcc and Vss at input. It comprises in particular a multiplier circuit 6m receiving, at input, the operating low voltage Vcc, for example of the order of 3 volts, and giving a read voltage of the order of 5 volts for row control voltage Vr.

According to the invention, the memory architecture furthermore comprises an address filtering circuit 7. This circuit is connected at input to the internal address bus ADR and delivers a filtering signal f at output, applied at input to the decoder 2 of the memory.

According to the invention, this filtering circuit provides for the filtering of the excessively rapid address transitions by inhibiting the decoder 2 for a duration d1 after the detection of any change of address on the internal address bus ADR.

Figure 2:
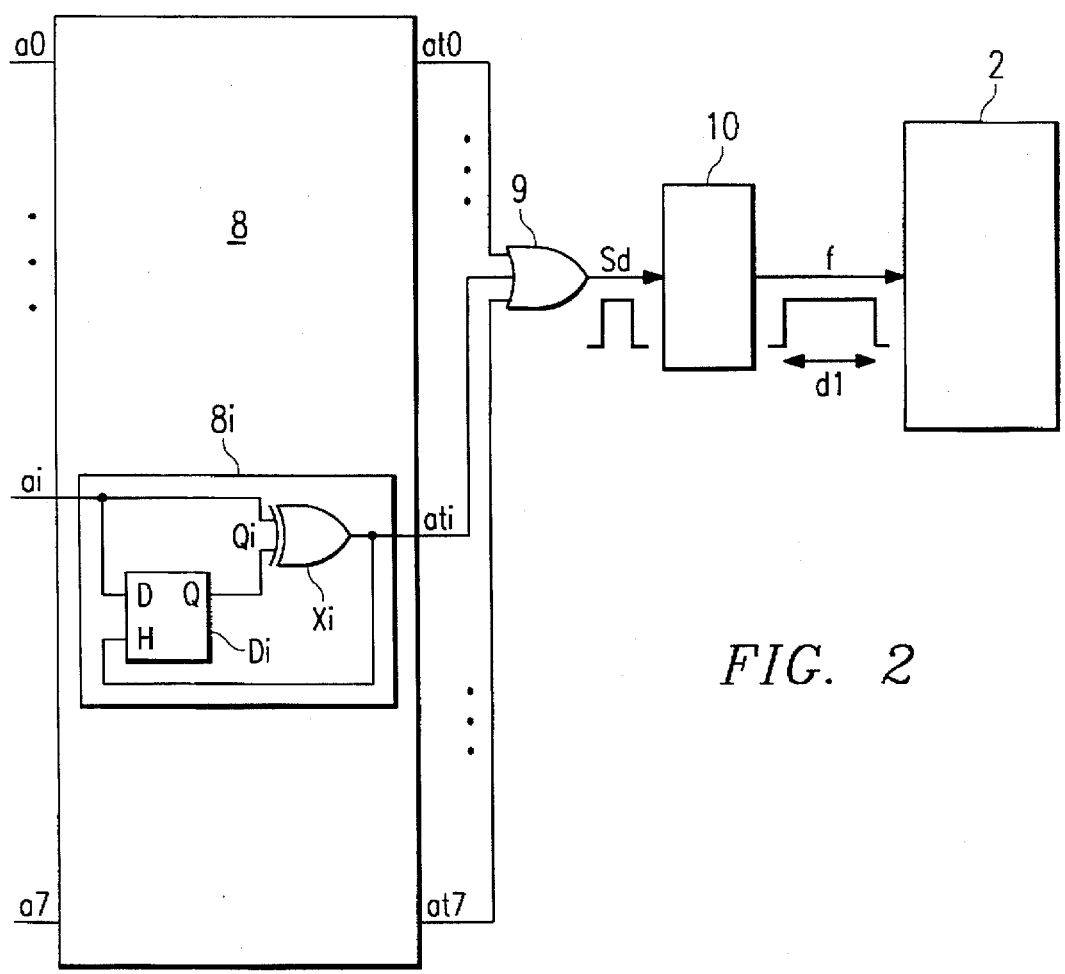
FIG. 2 shows an exemplary embodiment of a filtering circuit according to the invention.

In an exemplary embodiment of the filtering circuit shown in FIG. 2, this circuit 7 thus comprises a circuit 8 for the detection of a transition on each of the address bits, a logic OR gate circuit 9 to deliver an information element on a change of address as soon as at least one transition on an address bit is detected and a circuit 10 generating a pulse with a duration d1 on the filtering signal f.

More particularly, in the example shown, the circuit 8 for the detection of an address transition comprises one detection stage per address bit to be taken into account: each stage 8i receives an address bit referenced ai at input and delivers a corresponding detection signal referenced ati at output. A stage 8i comprises, for example, a flip-flop circuit Di and an exclusive-OR gate Xi. The input D of the flip-flop circuit receives the address bit ai and the output Q of the flip-flop circuit delivers a signal Qi. The exclusive-OR gate Xi receives the address bit ai at one input and the signal Qi at another input. The output of the exclusive-OR gate delivers the detection signal ati and this signal is looped to the clock signal (H) of the flip-flop circuit.

The principle of operation is simple. To detect an address transition, it is necessary to memorize the previous high or low logic state. This is made possible by the flip-flop circuit Di which memorizes the previous state at its output Q. The state of the corresponding signal Qi is always compared in the exclusive-OR gate with the current state of the address bit ai. The output ati of the gate Xi is at a first logic level (0 in the example) so long as the signals ai and Qi have the same logic signal. As soon as the signals ai and Qi have different logic states, the output of the gate Xi goes to a second logic level (1 in the example). The passage from the first level (0) to the second level (1) which corresponds to the detection of a transition on the address bit ai, prompts the memorizing of the current state of the bit ai which is applied to the input D of the flip-flop circuit. The signals ai and Qi then again have the same logic state and the output of the gate Xi goes back to the first logic state (0). The detection of an address transition on the bit ai therefore generates a very short pulse at the output ati.

The address transition detection signals ati are applied to the input of the OR gate circuit 9 to deliver, at output, a signal Sd pertaining to the detection of a change of address corresponding to a transition on at least one address bit. This signal Sd is applied to the pulse generation circuit 10 which will generate a pulse having a determined duration d1 in response to the change-of-address detection pulse. In a simple example (not described in detail in the figures), a pulse generation circuit may comprise an inverter to control the charging and discharging of a capacitor and a circuit for reshaping the signal given by the capacitor. Other more complex embodiments are possible. These commonly used circuits are well known to those skilled in the art.

According to the invention, the pulse having a determined duration d1 that is emitted on the filtering signal f inhibits the decoder 2 for this duration. In practice, the only addresses decoded therefore are those present on the address bus ADR for at least this duration d1.

Figure 3:
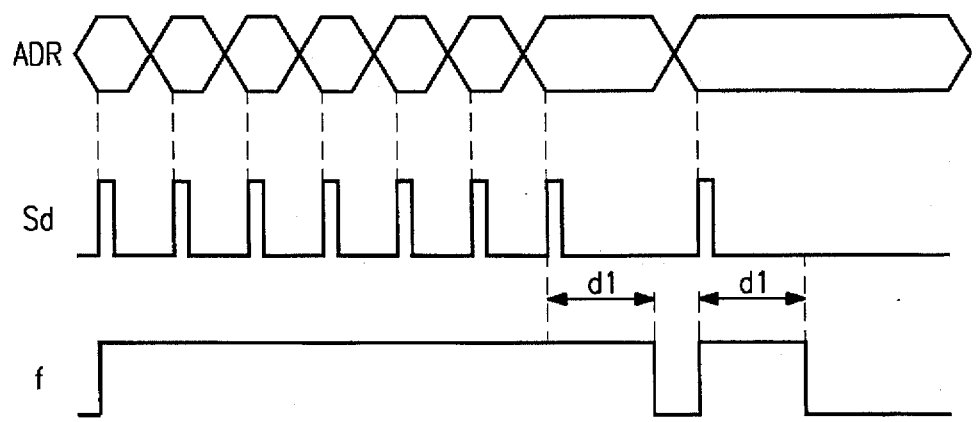
FIG. 3 is a timing diagram of the filtering circuit of FIG. 2.

The timing diagram shown in FIG. 3 illustrates the working of the filtering circuit. At each address transition on the address bus ADR, a change-of-address detection pulse is emitted at output Sd of the OR gate. In the example, six changes of address have been shown. These changes succeed each other very rapidly and are followed by two changes of address that succeed each other more slowly. The latter two addresses remain stable for a duration that is greater than d1.

The corresponding filtering signal f therefore has a first long pulse that starts on the first address detection pulse and stops after the last duration d1 controlled by the seventh change-of-address detection pulse. Then another pulse is emitted with a duration d1, upon the detection of the next change in address. The address then remains stable.

The invention is concerned above all with the row addresses of the memory: the filtering signal will therefore be applied more particularly according to the invention to the row decoder DR. In this case, the filtering circuit preferably receives only the row address bits, a0–a7 in the example (FIG. 2).

Furthermore, it has been seen that the decoder first carries out the decoding of the row addresses to select the corresponding row and, secondly, activates the application of the necessary voltages to the rows, namely the voltage Vr to the selected row and zero voltage (Vss) to the other rows which shall be said to be deselected. The decoder therefore comprises a pure decoding circuit and a voltage-switching circuit.

According to the invention, the filtering signal is then advantageously used (in an inhibition circuit) to inhibit the voltage switching circuit of the row decoder. Thus the address decoding is done in any case, in parallel with the change-of-address detection, and only the switching of the voltages is inhibited by the filtering signal. If, in the meantime, the selection of the row disappears, the voltages will not be applied.

Preferably, all that is filtered is the command for switching the voltage Vr over to the selected row. Indeed, when a row is selected, it is the zero voltage that is applied to it. This raises no problem of any collapse in the voltage generated by the multiplier 6m. Furthermore, the switching of the zero voltage (Vss), if the row has been selected earlier (at Vr), is slower than the switching of the voltage Vr. By delaying only the selection and not the deselection, the access time of a memory is improved with filtering of the addresses according to the invention.

According to the invention, the row decoder thus advantageously comprises, for each row, an inhibition circuit receiving the filtering signal f and a row selection command signal at input and delivering, at output, a filtered row selection command signal applied to a voltage switching circuit (Vr) for switching the voltage over to the selected row.

A preferred example of implementation of the filtering method according to the invention shall now be explained with reference to FIG. 4.

It corresponds to a memory comprising 512 address rows 0 to 511 organized for the decoding in k=16 blocks of i=32 rows. It is necessary to have eight address bits in order to address one row, these eight bits being referenced a0–a7. The address of the block is encoded on four bits, a5–a7 and the address of the row is encoded on five bits, a0–a4.

Thus, in a simple exemplary embodiment, the row decoder has k block address decoders delivering block enabling signals. For each block address decoder, there are 32 row address decoders. Each row address decoder delivers a selection command signal and a signal to command the deselection of the corresponding row.

Associated with each block, the row decoder also includes 32 voltage-switching circuits, with one circuit for each row. Each circuit is enabled by the output signals of the address decoder of the associated block and receives, at input, the command signal for the selection and the command signal for the deselection of the address decoder of the row to which it is connected at output and to which it switches over the voltage Vr (for selection) given by the voltage generation circuit 6 or the voltage Vss (for deselection).

Figure 4:
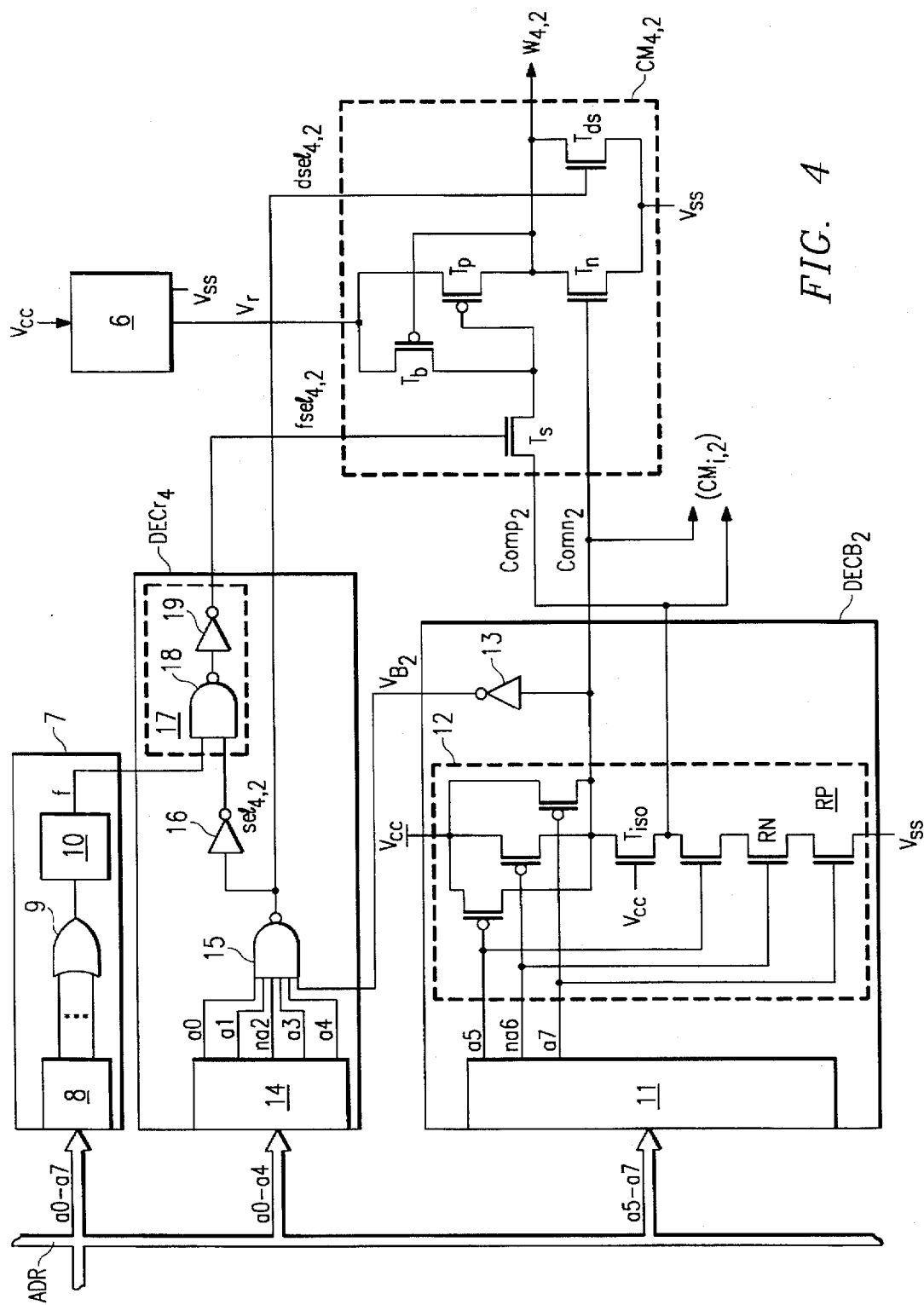
FIG. 4 shows a detailed architecture of a memory according to an embodiment of the invention.

Thus, FIG. 4 shows:
a decoder DECB2 of the address block 2,
a decoder DECR4 of the address row 4 of the block B2, and
a circuit CM4.2 for switching over the voltage to the address row 4 of the block B2 (namely to the address row 68 in the memory).

It will be noted that, by convention, it is chosen to have low active address bits and a mode of address decoding by means of NAND gates.

The decoder DECB2 therefore receives the bits a5–a7 from the internal address bus ADR at input, to recognize the address 2. It comprises an inverter stage 11, herein to invert the bit a6. At output of this stage, there are therefore the bits a5, na6 and a7 applied to the inputs of a NAND gate 12 with two isolated outputs comp2 and comn2. We therefore have comp2=comn2=/(a5.na6.a7). If it is truly the address of the block B2 that is present at the data bus, there will therefore be these two logic signals set at zero. If not, they will be taken to 1. It will be noted that in the case which is particularly relevant to the invention, pertaining to low-voltage circuits, the high level of the logic signals corresponds to the low voltage Vcc, for example equal to 3 volts.

The NAND gate with two isolated outputs is explained on the basis of CMOS technology in FIG. 4. The isolation is obtained in a known way by the interposing of an isolation transistor Tiso between a series network RN of N type transistors and a parallel network RP of P type transistors. One output comn2 is taken between the output of the parallel network and the isolation transistor. The other output comp2 is taken between the isolation transistor and the input of the series network (the output comp2 is the one that controls the switching of the voltage Vr, as shall be seen further below, hence the need for isolation between the two outputs).

These two output signals comp2 and comn2 for validating the selection of the block B2 are applied to the switching circuits CMi,2 of the block B2, especially to the circuit CM4,2. An inverter 13 of the signal comn2 furthermore delivers a signal VB2 for validating the decoding of the row addresses.

The decoder DECr4 of the address row 4 of the block B2 comprises a first circuit with an inverter stage 14 and a NAND gate 15 to decode the address (4) of this group. The NAND gate also receives at input the decoding enable signal VB2 delivered by the decoder to the associated block DECB2. The NAND gate is followed by an inverter 16 which delivers a row selection command signal sel4,2 at output.

A signal dsel4,2 to command the deselection of the address row of the block B2 is delivered directly by the output of the NAND gate. According to the invention, the row decoder furthermore comprises an inhibition circuit 17 receiving, at input, the inverted signal of the filtering signal f given by the filtering circuit 7 according to the invention and the row selection command signal sel4,2 to give a selection command signal that is filtered according to the method of the invention, referenced fsel4,2. This inhibition circuit, in the example, has a first NAND gate 18 followed in series by an inverter 19.

In the decoder described, if it is the row 4 of the block B2 that is actually addressed by the internal address bus ADR, the selection command signal will be at logic "1", namely at about 3 volts in logic low voltage and the deselection command signal dsel4,2 will be at logic "0". If not, it is the signal dsel4,2 that will be at "1" and the signal sel4,2 that will be at "0".

Now, according to the invention, the detection of a change of address on the bus generates a filtering signal f. The filtered selection command signal fsel4,2 at output of the inhibition circuit 17 according to the invention is therefore forced to the logic level "0" for at least a duration d1 upon the detection of a change of address, according to the timing diagram of FIG. 2. In fact, it is held at zero so long as there is no stable address for a duration of over d1. Then it takes the logic level of the selection command signal sel4,2. If the row 4 of the block B2 is actually addressed, it goes to the logic level "1".

It is this filtered selection command signal fsel4,2 that is applied with the deselection command signal dsel4,2 to the circuit CM4.2 for the switching of voltage on the address row 4 of the block B2, this circuit being associated with the decoder DECr4. In the example, this switching circuit comprises:

- a CMOS inverter that is series-connected between the voltage Vr and the voltage Vss, with a P type transistor referenced Tp and an N type transistor referenced Tn, the gate of the transistor Tn receiving the signal comp2 delivered by the decoder DECB2 and the output of the inverter (at the drains of the transistors Tp and Tn) being connected to the row to be controlled W4,2;
- an N-type selection transistor referenced Ts receiving, at its gate, the filtered selection command signal fsel4,2, its source being connected to the gate of the transistor Tp and its drain receiving the signal comp2 delivered by the decoder DECB2;
- a P-type latching transistor referenced Tb connected between the voltage Vr and the gate of the transistor Tp, having its gate connected to the output of the inverter;
- an N-type deselection transistor referenced Tds controlled at its gate by the deselection command signal dsel4,2 having its source connected to Vss and its drain connected to the output of the inverter.

In this circuit which has to switch the voltage Vr to the row if the row is selected or the voltage Vss to the row if the row is deselected, the control signals comp2, comn2 are active in the low state, referenced "0", and corresponding to the zero logic voltage Vss and the signals fsel4,2 and dsel4,2 are active in the high state, referenced "1" and corresponding to the high logic voltage, Vcc (3 volts in the example).

The principle of operation is simple: when the block 2 is addressed and if the row 4 is selected, the control signals comn2, comp2 are at "0" and the signals fsel4,2 are at "1". The signal dsel4,2 is at "0".

The signal comn2 ("0") applied to the gate of the transistor Tn (which has a positive threshold voltage) turns it off, while the selection transistor Ts is turned on by the signal fsel4,2 ("1"): the transistor Tp of the inverter is therefore on and thus switches the voltage Vr over to the row W4,2.

If the row 4 of the block B2 is deselected, it is the signal dsel4,2 that becomes active ("1") and makes the deselection transistor Tds conductive, the transistors Ts and Tp being off. The row is then taken to Vss.

If the block is not selected, the control signals comn2, comp2 are both at "1", the filtered selection command signal fsel4,2 is at "0" and the deselection command signal dsel4,2 is at "1". Consequently, the transistors Ts and Tp are off while the transistors Tn and Tds are on. This has the effect of keeping the deselected row grounded (if the row has been previously deselected) or of taking it to the ground (if the row had been previously selected).

The latching transistor Tb is on if the row is grounded: it thus places the voltage Vr on the gate of the transistor Tp which keeps it off.

Since it has been seen further above that the filtered selection command signal fsel4,2 is kept at "0" by the inhibition circuit 17 so long as an address is not stable as understood in the invention (namely present for at least a duration d1), the transistor Tp is off, preventing any drawing of current on the voltage line Vr. The multiplier therefore is not acted upon so long as an address is not stable on the bus.

The exemplary embodiment of the decoder that has just been explained with reference to FIG. 4 and more generally the inhibition of the selection command (sel4,2) makes it possible to delay only the switching of the voltage Vr over to the selected row. In particular, the decoding and the deselection are not delayed.

The filtering method according to the invention provides for the working of the low voltage asynchronous memories to be made compatible with the use of an internal voltage multiplier, and its preferred embodiment advantageously makes it possible not to excessively penalize the access time of the memory.

In a sample embodiment, the W/L dimensions of transistors are as follows:

Tds: 20μ/0.8μ;
Tn: 5μ/0.8μ;
Tp: 25μ/1μ;
Tb: 3.5μ/1μ.

Preferably, the maximum duration d1 corresponds to the maximum duration needed for the decoding of the address, so that the filtering according to the invention has the least possible influence on the access time of the memory.

According to a disclosed class of innovative embodiments, there is provided: A method for operating a low-voltage integrated circuit memory, comprising the steps of: generating a boosted voltage, from a power supply voltage and ground, which is not intermediate therebetween; decoding externally received addresses, to produce decoded addresses which each indicate at least one selected row and at least one selected column of at least one memory array of said integrated circuit; detecting transitions of said externally received addresses, and, after each said transition, generating an inhibit signal which remains active for a substantially predetermined period of time; after a delay which is greater than said substantially predetermined period of time, switching over said boosted voltage to said selected row of said array which corresponds to said decoded address, only if said inhibit signal is then inactive; and accessing said selected column of said array, to provide access to a selected cell which is connected to said selected row and to said selected column.

According to another disclosed class of innovative embodiments, there is provided: A method for the decoding of the addresses in a memory organized in matrix form in rows and columns, with a row decoder comprising a decoding circuit to select an addressed row and deselect the other rows and a circuit for switching voltage over to the rows, an inhibition command being generated at each change of address detected on an address bus, wherein the inhibition command is applied to said voltage switching circuit.

According to another disclosed class of innovative embodiments, there is provided: An integrated circuit memory, comprising: a charge pump which generates a boosted voltage, from a power supply voltage and ground, which is not intermediate therebetween; a row decoder which is connected to receive and decode externally received addresses, to produce, from row address bits thereof, decoded row addresses which each indicate at least one a selected row of at least one memory array of said integrated circuit; a column decoder which is connected to receive and decode said externally received addresses, to produce, from column address bits thereof, decoded column addresses which each indicate at least one selected column of said array; transition detect circuitry which is connected to detect transitions of said externally received addresses, and to generate an inhibit signal which remains active for a substantially predetermined period of time after each said transition; said row decoder including circuitry for switching over said boosted voltage to said selected row of said array which corresponds to said decoded address, only if said inhibit signal is then inactive; and accessing said selected column of said array, to provide access to a selected cell which is connected to said selected row and to said selected column.

According to another disclosed class of innovative embodiments, there is provided: An integrated circuit memory organized in matrix form in rows and columns, the row decoder comprising an address decoding circuit to select an addressed row and deselect the other rows and a circuit for switching voltage over to the rows, wherein the row decoder comprises an inhibition circuit receiving the filtering signal to inhibit the voltage switching circuit.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

As noted above, the disclosed inventions are particularly advantageous in "low voltage" systems. In current terminology, such systems would include not only 3.3V systems, but also other present or proposed operating voltages of 3.5V or below, including e.g. 3.1V, 2.5V, or 2.2V as well.

In the drawings a single memory array is shown for simplicity, but of course the disclosed innovations are readily applicable to integrated circuits which contain multiple subarrays of memory cells.

Similarly, the disclosed innovations are readily applicable to integrated circuits which provide byte-wide access (e.g. ×8, ×9, or ×16 parallel access).

Preferably all address lines are monitored to provide the inhibit signal. However, this is not strictly necessary: in memories which use various accelerated access modes, the minimum time between legitimate column accesses may be less than the minimum time between legitimate row accesses. In such cases the disclosed innovations can be adapted to perform filtering based only on row address transitions, or to perform filtering based on row address transitions (with a first minimum delay) and on column address transitions (with a second minimum delay which is smaller).

Similarly, the particular circuitry used to generate the boosted word line voltage is unimportant. Numerous well-known integrated charge pump circuits can be used. Similarly, numerous other power-saving strategies can (and typically will be) used in low-power applications, but such strategies are not particularly relevant to the disclosed innovations.

In adapting the disclosed invention to other embodiments, the minimum delay is of course adjusted for the speed of the memory, and for the allowable range of access variations over temperature and process, so that legitimate accesses are not cut off.

It should be noted that various self-timing techniques are well know for optimizing asynchronous operation of memories; see e.g. U.S. Pat. No. 4,601,019, which is hereby incorporated by reference. Numerous techniques of this kind can be adapted for use with the disclosed innovations.

As noted above, the sample embodiment is a floating-gate memory (e.g. a FLASH memory). However, the disclosed innovations are not limited to this technology. The disclosed innovations can also be used in low-voltage DRAMs and SRAMs, or in other memory technologies.

What is claimed is:

1. A method for operating a low-voltage integrated circuit memory, comprising the steps of:
    (a.) generating a boosted voltage, from a power supply voltage and ground, which is not intermediate therebetween;
    (b.) decoding externally received addresses, to produce decoded addresses which each indicate at least one selected row and at least one selected column of at least one memory array of said integrated circuit;
    (c.) detecting transitions of said externally received addresses, and, after each said transition, generating an inhibit signal which remains active for a substantially predetermined period of time;
    (d.) after a delay which is greater than said substantially predetermined period of time, switching over said boosted voltage to said selected row of said array which corresponds to said decoded address, only if said inhibit signal is then inactive; and
    (e.) accessing said selected column of said array, to provide access to a selected cell which is connected to said selected row and to said selected column.

2. The method of claim 1, wherein said power supply voltage is positive and less than 3.5 V.

3. The method of claim 1, wherein predetermined duration corresponds to the maximum time needed for the decoding step to select an addressed row.

4. The method of claim 1, wherein said power supply voltage is positive and less than 3.5 V, and said boosted voltage is at least 5 V.

5. The method of claim 1, wherein at least part of said decoding step includes multiple sequential substeps of decoding.

6. The method of claim 1, wherein each said cell is a floating-gate memory cell.

7. A method for the decoding of addresses in a memory organized in matrix form in rows and columns, with a row decoders, comprising the steps of:
- (a.) after an address transition is detected, selecting an addressed row and deselecting other rows using a decoder circuit;
- (b.) switching voltage from a voltage switching circuit over said selected address;
- (c.) generating an inhibition command at each change of address detected on an address bus, wherein the inhibition command is applied to said voltage switching circuit;
- (d.) applying said voltage from said voltage switching circuit while the inhibition command is inactive.

8. A decoding method according to claim 7, wherein the determined duration corresponds to the maximum time needed for the decoding circuit to select an addressed row.

9. An integrated circuit memory, comprising:
- a charge pump which generates a boosted voltage, from a power supply voltage and ground, which is not intermediate therebetween;
- a row decoder which is connected to receive and decode externally received addresses, to produce, from row address bits thereof, decoded row addresses which each indicate at least one a selected row of at least one memory array of said integrated circuit;
- a column decoder which is connected to receive and decode said externally received addresses, to produce, from column address bits thereof, decoded column addresses which each indicate at least one selected column of said array;
- transition detect circuitry which is connected to detect transitions of said externally received addresses, and to generate an inhibit signal which remains active for a substantially predetermined period of time after each said transition;
- said row decoder including circuitry for switching over said boosted voltage to said selected row of said array which corresponds to said decoded address, only if said inhibit signal is then inactive; and
- (a.) accessing said selected column of said array, to provide access to a selected cell which is connected to said selected row and to said selected column.

10. The memory of claim 9, wherein said power supply voltage is positive and less than 3.5 V.

11. The memory of claim 9, wherein said predetermined duration corresponds to the maximum time needed for the decoding step to select an addressed row.

12. The memory of claim 9, wherein said power supply voltage is positive and less than 3.5 V, and said boosted voltage is at least 5 V.

13. The memory of claim 9, wherein at least part of said decoding step includes multiple sequential substeps of decoding.

14. The memory of claim 9, wherein each said cell is a floating-gate memory cell.

15. An integrated circuit memory organized in matrix form in rows and columns, the row decoder comprising an address decoding circuit to select an addressed row and deselect the other rows and a circuit for switching voltage over to the rows, wherein the row decoder comprises an inhibition circuit receiving a filtering signal to inhibit the voltage switching circuit.

16. An integrated circuit memory according to claim 15, the address decoding circuit comprising, for each row, a decoding stage to deliver a row selection command signal and a row deselection command signal and the switching circuit comprising, for each row, a switching stage to switch a selection voltage or a deselection voltage over to the row according to the logic state of said control signals wherein, for each decoding stage, the decoding circuit comprises an inhibition circuit receiving the filtering signal f and the corresponding row selection command signal for the delivery, at output, of a filtered row selection command signal applied with the corresponding deselection command signal to the switching stage.

17. An integrated circuit memory according to claim 15, wherein the row decoder comprises, for each row, an inhibition circuit receiving, at input, the filtering signal and a signal to command the selection of said row to apply a filtered selection command signal to a circuit for switching a selection voltage over to said row.

18. An integrated circuit memory according to claim 15, wherein the filtering circuit comprises a circuit for the detection of address transitions receiving, at input, the address bits and delivering, at output, signals relating to the detection of the transition of the corresponding bit, an OR gate receiving said transition detection signals at input to deliver a pulse signal relating to the detection of a change of address, and a pulse generator circuit receiving said detection pulse signal at input and delivering the filtering signal at input to give, at output, a pulse with a duration equal to the determined duration in response to a pulse on the detection pulse signal.

19. An integrated circuit memory according to claim 16, wherein the filtering circuit comprises a circuit for the detection of address transitions receiving, at input, the address bits and delivering, at output, signals relating to the detection of the transition of the corresponding bit, an OR gate receiving said transition detection signals at input to deliver a pulse signal relating to the detection of a change of address, and a pulse generator circuit receiving said detection pulse signal at input and delivering the filtering signal at input to give, at output, a pulse with a duration equal to the determined duration in response to a pulse on the detection pulse signal.

20. An integrated circuit memory according to claim 17, wherein the filtering circuit comprises a circuit for the detection of address transitions receiving, at input, the address bits and delivering, at output, signals relating to the detection of the transition of the corresponding bit, an OR gate receiving said transition detection signals at input to deliver a pulse signal relating to the detection of a change of address, and a pulse generator circuit receiving said detection pulse signal at input and delivering the filtering signal at input to give, at output, a pulse with a duration equal to the determined duration in response to a pulse on the detection pulse signal.

* * * * *